(12) United States Patent
Ishimi

(10) Patent No.: US 6,614,865 B1
(45) Date of Patent: Sep. 2, 2003

(54) PHASE-SHIFT-RESISTANT, FREQUENCY VARIABLE CLOCK GENERATOR

(75) Inventor: Kouichi Ishimi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/476,127

(22) Filed: Jan. 3, 2000

(30) Foreign Application Priority Data

Jul. 19, 1999 (JP) ........................................... 11-204509

(51) Int. Cl.⁷ ................................................. H03D 3/24
(52) U.S. Cl. ........................ 375/373; 327/115; 327/117
(58) Field of Search .............................. 375/354, 355, 375/371, 373, 375; 327/291, 298, 141, 144, 113, 115, 117, 116, 119

(56) References Cited

U.S. PATENT DOCUMENTS

| 6,049,238 | A | * | 4/2000 | Shimizu et al. ............. 327/156 |
| 6,184,753 | B1 | | 2/2001 | Ishimi et al. |
| 6,225,840 | B1 | * | 5/2001 | Ishimi ........................ 327/116 |
| 6,292,040 | B1 | * | 9/2001 | Iwamoto et al. ............ 327/158 |

FOREIGN PATENT DOCUMENTS

| DE | 198 32 313 | 6/1999 |
| JP | 54-146926 | 11/1979 |
| JP | 57-34245 | 2/1982 |
| JP | 4-12842 | 3/1992 |

* cited by examiner

*Primary Examiner*—Jean B. Corrielus
(74) *Attorney, Agent, or Firm*—Burns, Doane, Swecker & Mathis, LLP

(57) ABSTRACT

A clock generator includes a frequency divider for outputting a divided clock signal by dividing an input clock signal in accordance with a dividing ratio control signal; and a phase adjusting circuit for adjusting a phase of an internal clock signal with that of an external clock signal. The frequency divider further includes a dividing ratio control signal inhibiting circuit for disabling the dividing ratio control signal as long as a lock signal supplied from the phase adjusting circuit is active. The frequency divider generates a particular clock signal as long as the dividing ratio control signal is disabled, and changes the frequency of the divided clock signal by enabling the dividing ratio control signal in synchronism with the particular clock signal when the lock signal is made inactive. The period of the particular clock signal is preferably set at a value greater than a phase adjustable range of the internal clock signal by the phase adjusting circuit, and particularly at a value equal to the longest period of the divided clock signals generated by the frequency divider. This makes it possible to prevent frequency shift involved in frequency switching in a conventional clock generator, and to save power.

15 Claims, 7 Drawing Sheets

| DIVIDING RATIO CONTROL SIGNALS C1-C3 | LOCK | Q1-Q3 | SEL | DIVIDING RATIO |
|---|---|---|---|---|
| 0 0 0 | 1 | 0 0 0 | 10000000 | 1/128 |
| 0 0 1 | 1 | 0 0 1 | 01000000 | 1/64 |
| 0 1 0 | 1 | 0 1 0 | 00100000 | 1/32 |
| 0 1 1 | 1 | 0 1 1 | 00010000 | 1/16 |
| 1 0 0 | 1 | 1 0 0 | 00001000 | 1/8 |
| 1 0 1 | 1 | 1 0 1 | 00000100 | 1/4 |
| 1 1 0 | 1 | 1 1 0 | 00000010 | 1/2 |
| 1 1 1 | 1 | 1 1 1 | 00000001 | 1/1 |
| X X X | 0 | 0 0 0 | 10000000 | 1/128 |

PHASE-SHIFT-RESISTANT, FREQUENCY VARIABLE CLOCK GENERATOR

BACKGROUND OF THE INVENTION

1. Field of the Invention

The present invention relates to a clock generator, and more particularly to a clock generator capable of varying its frequency.

2. Description of Related Art

Recently, power saving of semiconductor devices has made a considerable progress. One of the techniques for saving power is to reduce the clock frequency in accordance with the operation mode of a system.

A PLL (Phase Locked Loop) outputs a clock signal synchronized with an input clock signal and having the same or multiplication frequency as the input clock signal. It is essential for recent microprocessors to incorporate the PLL because it can operate at a clock frequency of tens to hundreds megahertz.

FIG. 7 is a block diagram showing a conventional clock generator including such a PLL. Referring to FIG. 7, the clock generator 1000 comprises a PLL 1010 to which an input clock signal is supplied from the outside or inside of the semiconductor device, and a frequency divider 1011 to which the output of the PLL 1010 and a dividing ratio control signal are supplied.

The clock generator further comprises an output buffer 1013 that receives a divided clock signal from the frequency divider 1011 and outputs an external system clock signal; a comparator 1018 that compares the phase of the external system clock signal with that of a feedback clock signal and determines a delay quantity of a DLL (Delay Locked Loop) 1015 in accordance with the compared result; the DLL 1015 that receives the divided clock signal from the frequency divider 1011 and controls its delay quantity in response to the output of the comparator 1018; and an internal circuit 1017 that receives the internal clock signal from the DLL 1015 and a reset signal RST.

The conventional clock generator operates as follows. First, the frequency divider 1011 divides the frequency of the PLL output, and changes the frequency of the divided clock signal by controlling the dividing ratio. The dividing ratio control signal can be supplied directly from the outside of the semiconductor device, or from a circuit on the same substrate operated by the internal clock signal or by a clock signal other than the internal clock signal.

The divided clock signal is translated to the internal clock signal to be supplied to the internal circuit 1017, and to the external system clock signal to be supplied to the outside of the semiconductor device. In this case, it is necessary to match the phase of the external system clock signal with that of the internal clock signal. This is carried out by the DLL 1015 that controls the phase of the external system clock signal and that of the internal clock signal.

FIG. 8 is a circuit diagram showing the frequency divider 1011 of the conventional clock generator 1000. Referring to FIG. 8, the frequency divider 1011 comprises a 1/128 frequency divider 1031a, a 1/64 frequency divider 1031b, ..., a 1/4 frequency divider 1031f, a 1/2 frequency divider 1031g and a 1/1 frequency divider 1031h, all of which receive the PLL output; a flip-flop 1035 that receives the dividing ratio control signal and a clock signal from the 1/128 frequency divider 1031a; and a multiplexer 1037 for selecting one of the outputs from the 1/128 frequency divider 1031a to 1/1 frequency divider 1031h in response to the output of the D flip-flop 1035.

Smooth switching of the frequency is achieved by setting the delay time of the 1/128 frequency divider 1031a to 1/1 frequency divider 1031h at the same delay time, and by controlling the dividing ratio control signal by the clock signal with the highest dividing ratio (1/128).

FIG. 9 is a timing chart about the conventional clock generator. Referring to FIG. 9, the divided clock signal, internal clock signal and external system clock signal are produced from the frequency divider 1011, DLL 1015 and output buffer 1013 of the clock generator 1000, respectively, by dividing the PLL output. In this case, phase shift can take place between the internal clock signal and external system clock signal when the dividing ratio of the PLL output is changed from two to four, for example.

More specifically, the DLL 1015 can enter a locked state even when the delay time from the output of the divided clock signal to the output of the internal clock signal is shifted exactly one period of the 1/2 clock signal from the delay time from the output of the divided clock signal to the output of external system clock signal. Thus, when changing the dividing ratio from two to four in this state, the internal clock signal will be out of phase after the change as illustrated in FIG. 9, even though it is in-phase before the change.

Therefore, it is necessary for the clock generator 1000 to lock the PLL 1010 or the DLL 1015 again when switching the output frequency of the frequency divider 1011. As a result, such a processing as halting the internal clock signal or resetting the internal circuit 1017 is required to prevent erroneous operation of the internal circuit 1017 when switching the frequency. Thus, the conventional frequency switching is time wasting.

In addition, when the dividing ratio of the clock generator 1000 is low, that is, when it operates at a high speed, the PLL 1010 or DLL 1015 also operates at a high clock frequency by the time it is locked, thereby wasting power.

In summary, the conventional clock generator has a problem of causing phase shift unless the PLL is locked again when switching the frequency. In addition, it has a problem of wasting power when a low dividing ratio is set.

SUMMARY OF THE INVENTION

The present invention is implemented to solve the foregoing problems. It is therefore an object of the present invention to provide a power-saving clock generator capable of preventing the phase shift between the clock signals.

According to a first aspect of the present invention, there is provided a clock generator comprising: a frequency divider for outputting a divided clock signal by dividing an input clock signal in accordance with a dividing ratio control signal; an external clock output circuit for generating an external clock signal from the divided clock signal; an internal clock output circuit for generating an internal clock signal from the divided clock signal; and a phase adjusting circuit for adjusting a phase of the internal clock signal with that of the external clock signal, wherein the frequency divider further comprises a dividing ratio control signal inhibiting circuit for disabling the dividing ratio control signal as long as a lock signal supplied from the phase adjusting circuit is active, generates a particular clock signal as long as the dividing ratio control signal is disabled, and changes the frequency of the divided clock signal by enabling the dividing ratio control signal in synchronism with the particular clock signal when the lock signal is made inactive.

Here, the period of the particular clock signal may be greater than a phase adjustable range of the internal clock signal by the phase adjusting circuit.

The particular clock signal may have a longest period in divided clock signals generated by the frequency divider.

The clock generator may further comprise an internal circuit that operates in response to the internal clock signal, wherein the clock generator may maintain a reset state of the internal circuit before the divided clock signal is switched to a desired clock frequency.

The clock generator may further comprise a circuit for halting outputting the internal clock signal before the divided clock signal is switched to a desired clock frequency.

According to a second aspect of the present invention, there is provided a clock generator comprising: a frequency divider for outputting a divided clock signal by dividing an input clock signal in accordance with a dividing ratio control signal; an external clock output circuit for generating an external clock signal from the divided clock signal; an internal clock output circuit for generating an internal clock signal from the divided clock signal; and a phase adjusting circuit for adjusting a phase of the internal clock signal with that of the external clock signal, wherein the frequency divider further comprises a dividing ratio control signal inhibiting circuit for disabling the dividing ratio control signal as long as a control signal takes a first value, generates a particular clock signal as long as the dividing ratio control signal is disabled, and changes the frequency of the divided clock signal by enabling the dividing ratio control signal in synchronism with the particular clock signal when the lock signal is placed at a second value.

Here, the period of the particular clock signal may be greater than a phase adjustable range of the internal clock signal by the phase adjusting circuit.

The particular clock signal may have a longest period in divided clock signals generated by the frequency divider.

Here, the control signal may be placed at the first value at power-on.

The control signal may be placed at the first value at a reset.

The control signal may be placed at the second value after a fixed time interval or after fixed clock cycles after the control signal is placed at the first value.

The control signal may be placed at the second value after the output clock signal is stabilized.

The clock generator may further comprise an internal circuit that operates in response to the internal clock signal, wherein the clock generator may maintain a reset state of the internal circuit before the divided clock signal is switched to a desired clock frequency.

The clock generator may further comprise a circuit for halting outputting the internal clock signal before the divided clock signal is switched to a desired clock frequency.

DETAILED DESCRIPTION OF THE PREFERRED EMBODIMENTS

The invention will now be described with reference to the accompanying drawings.

Embodiment 1

Figure 1:
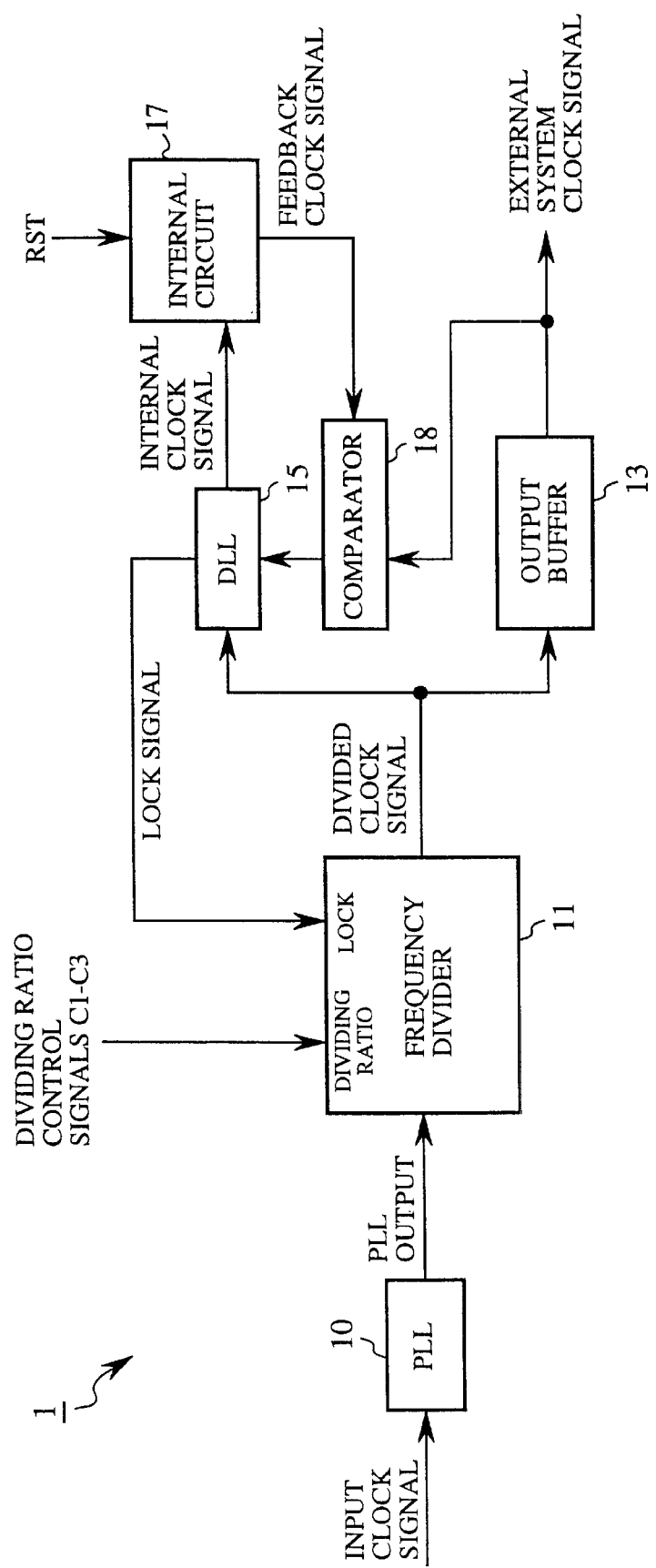
FIG. 1 is a block diagram showing an embodiment 1 of a clock generator in accordance with the present invention.

FIG. 1 is a block diagram showing an embodiment 1 of the clock generator in accordance with the present invention. Referring to FIG. 1, the clock generator 1 comprises a PLL 10 to which an input clock signal is supplied from the outside or inside of the semiconductor device, and a frequency divider 11 to which the output of the PLL 10 and a dividing ratio control signal are supplied.

The clock generator 1 further comprises an output buffer 13 that receives a divided clock signal from the frequency divider 11 and outputs an external system clock signal; a comparator 18 that compares the phase of the external system clock signal with that of a feedback clock signal and sets a delay quantity of a DLL 15 in accordance with the compared result; the DLL 15 that receives the divided clock signal from the frequency divider 11 and controls its delay quantity in response to the output of the comparator 18; and an internal circuit 17 that receives an internal clock signal from the DLL 15 and a reset signal RST.

The frequency divider 11 further receives a lock signal from the DLL 15.

Figure 2:
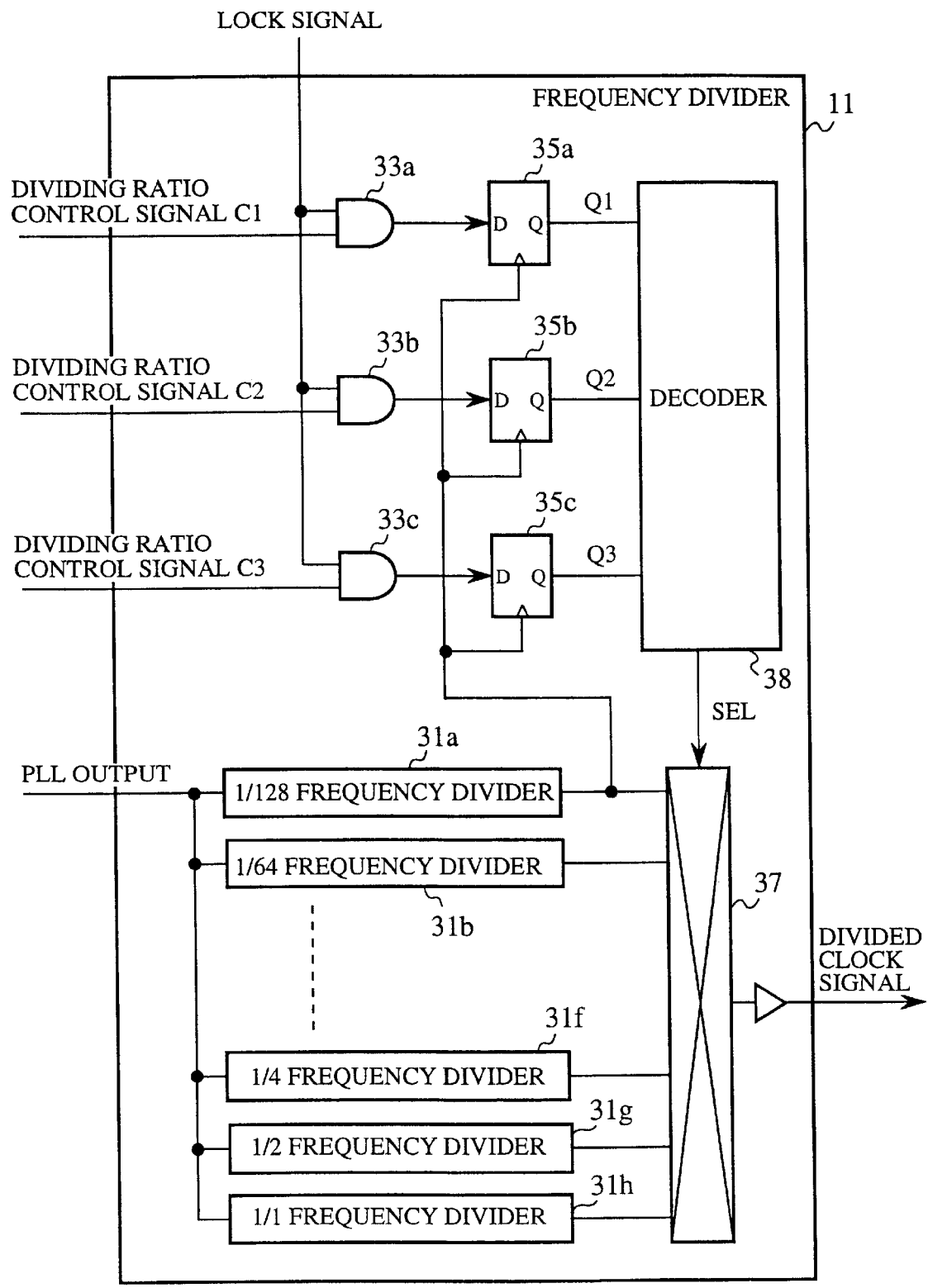
FIG. 2 is a circuit diagram of a frequency divider of the embodiment 1.

FIG. 2 is a circuit diagram showing the frequency divider of the present embodiment 1 of the clock generator. Referring to FIG. 2, the frequency divider 11, which is controlled by the dividing ratio control signals C1–C3, comprises a 1/128 frequency divider 31a, 1/64 frequency divider 31b, . . . , 1/4 frequency divider 31f, 1/2 frequency divider 31g and 1/1 frequency divider 31h, all of which are supplied with the PLL output.

The frequency divider 11 further comprises an AND circuit 33a to which the dividing ratio control signal C1 and the lock signal are supplied; an AND circuit 33b to which the dividing ratio control signal C2 and the lock signal are supplied; and an AND circuit 33c to which the dividing ratio control signal C3 and the lock signal are supplied.

It further comprises a D flip-flop 35a to which the clock signal from the 1/128 frequency divider 31a and the output of the AND circuit 33a are supplied; a D flip-flop 35b to which the clock signal from the 1/128 frequency divider 31a and the output of the AND circuit 33b are supplied; and a D flip-flop 35c to which the clock signal from the 1/128 frequency divider 31a and the output of the AND circuit 33c are supplied.

In addition, it comprise a decoder 38 that receives outputs Q1–Q3 of the D flip-flops 35a, 35b and 35c, and outputs select data SEL; and a multiplexer 37 for selecting one of the outputs of the 1/128 frequency divider 31a to 1/1 frequency divider 31h in response to the select data SEL.

Figures 3, 4:
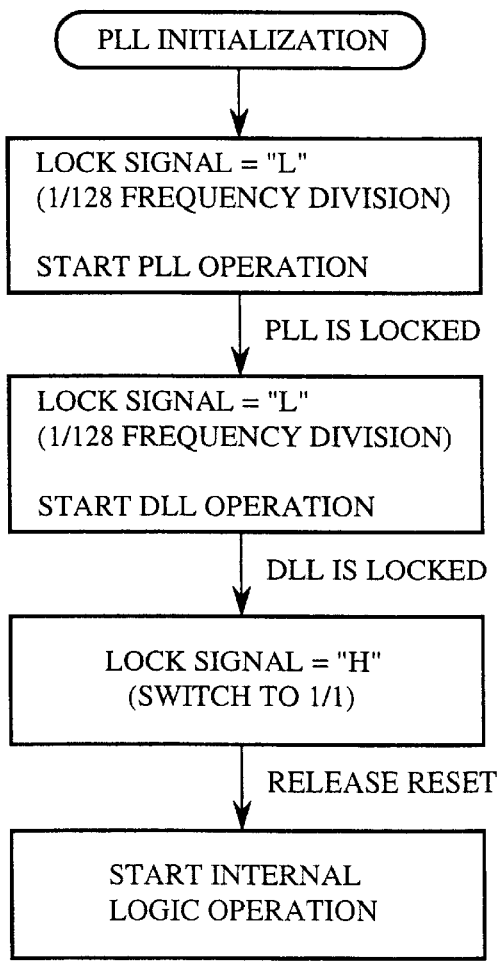
FIG. 3 is a list of the dividing ratio control signals and dividing ratios of the frequency divider in the embodiment 1.
FIG. 4 is a flowchart illustrating a switching operation of the embodiment 1 of the clock generator.

FIG. 3 is a list of the dividing ratio control signals C1–C3 and the dividing ratios of the frequency divider 11 of the present embodiment 1. Referring to FIG. 3, the frequency divider 11 is controlled by the dividing ratio control signals C1–C3, thereby switching the dividing ratio from 1/1 to 1/128. When the lock signal is "0", the dividing ratio is 1/128 regardless of the dividing ratio control signals.

The 1/128 frequency divider 31a to 1/1 frequency divider 31h have the same delay time each. In other words, the rising edge of all the 1/128 frequency divider 31a to 1/1 frequency divider 31h are adjusted to synchronize with the rising edge of the 1/128 frequency divider 31a.

Accordingly, switching the dividing ratio control signals in synchronism with the rising edge of the output of the 1/128 frequency divider 31a can carry out a smooth frequency change without involving any spikes or glitches, and can change the dividing ratio even during the operation of the internal circuit 17.

The divided clock signal output from the frequency divider 11 is supplied to the outside of the clock generator 1 through the output buffer 13 as the external system clock signal. It is also supplied to the internal circuit 17 through the DLL 15 as the internal clock signal. The DLL 15 adjusts the phase of the external system clock signal and that of the internal clock signal.

The DLL 15 controls a load variation range of the external system clock signal. For example, if the variation range is about 10 ns at the maximum, the range of control by the DLL 15 is about 20 ns.

In addition, when the PLL output is 100 MHz (10 ns in period), the period of the output of the 1/128 frequency divider 31a is 1.28 $\mu$s, which is sufficiently large as compared with the control range of the DLL 15. Accordingly, when the DLL 15 locks in response to the 1/128 pulse train, the delay time from the divided clock signal to the internal clock signal becomes equal to the delay time from the divided clock signal to the external system clock signal, thereby making it possible to prevent the phase shift during the switching of the dividing ratio.

Furthermore, when the DLL 15 is locked by the 1/128 pulse train, the clock frequency of the internal clock signal or of the feedback clock signal is 1/128 of the 1/1 pulse train. Therefore, the number of switching of the clock signal of the internal clock signalor of the feedback clock signal is reduced by a factor of 128, and hence the power consumed by the switching is also reduce by the factor of 128.

FIG. 4 is a flowchart illustrating the operation of the present embodiment 1 of the clock generator. Referring to FIG. 4, when the clock generator 1 is initialized at power-on or reset, the initial value of the lock signal is "L" (low).

Once the PLL 10 locks, and outputs a stable PLL output, the DLL 15 starts the phase adjustment. The DLL 15 varies its delay time in accordance with the compared result of the comparator 18 that compares the phase of the feedback clock signal fed from the internal circuit 17 with the phase of the external system clock signal, and synchronizes the phase of the feedback clock signal with that of external system clock signal. In this case, since the lock signal is "L", the divided output becomes 1/128.

When the DLL 15 maintains the locked state for a fixed time interval, it rises the lock signal to "H". When the DLL 15 locks in response to the 1/128 clock signal, the two delay times, that is, the delay time from the output of the divided clock signal to that of the internal clock signal, and the delay time from the divided clock signal to the external system clock signal, lock in the same state. This is because the period of the 1/128 clock signal is longer than the range the DLL 15 can adjust.

When the lock signal rises to "H", the divided output is switched to a desired frequency through the AND circuit 33a (or 33b or 33c), D flip-flop 34a (or 34b or 34c), decoder 38 and multiplexer 37. Since the delay time from the divided clock signal to the internal clock signal is equal to the delay time from the divided clock signal to the external system clock signal, the transition timings of their frequencies are identical, thereby preventing the phase shift.

After switching to the desired frequency, the internal circuit 17 starts its operation. Specifically, the clock signal supplied to the internal circuit 17 is halted until the lock signal rises to "H", and is supplied to the internal circuit 17 after the internal clock signal is switched to the desired frequency. This can prevent the erroneous operation of the clock generator.

Alternatively, it is possible to maintain the internal circuit 17 at a reset state by keeping the reset signal RST at an active state until the lock signal takes place, and then to release the reset signal RST after the internal clock signal is switched to the desired frequency. This makes it possible to provide a clock generator further resistant to erroneous operation.

As described above, according to the present embodiment 1, the internal circuit can always operate in the same state as when it starts its operation at a desired frequency. This makes it possible to prevent the phase shift between the internal clock signal and the external system clock signal when the dividing ratio is switched afterward. Furthermore, the power consumed before the lock can be reduced because the lock is carried out using the low clock frequency. Moreover, the present embodiment 1 can provide the clock generator resistant to erroneous operation.

Embodiment 2

Figure 5:
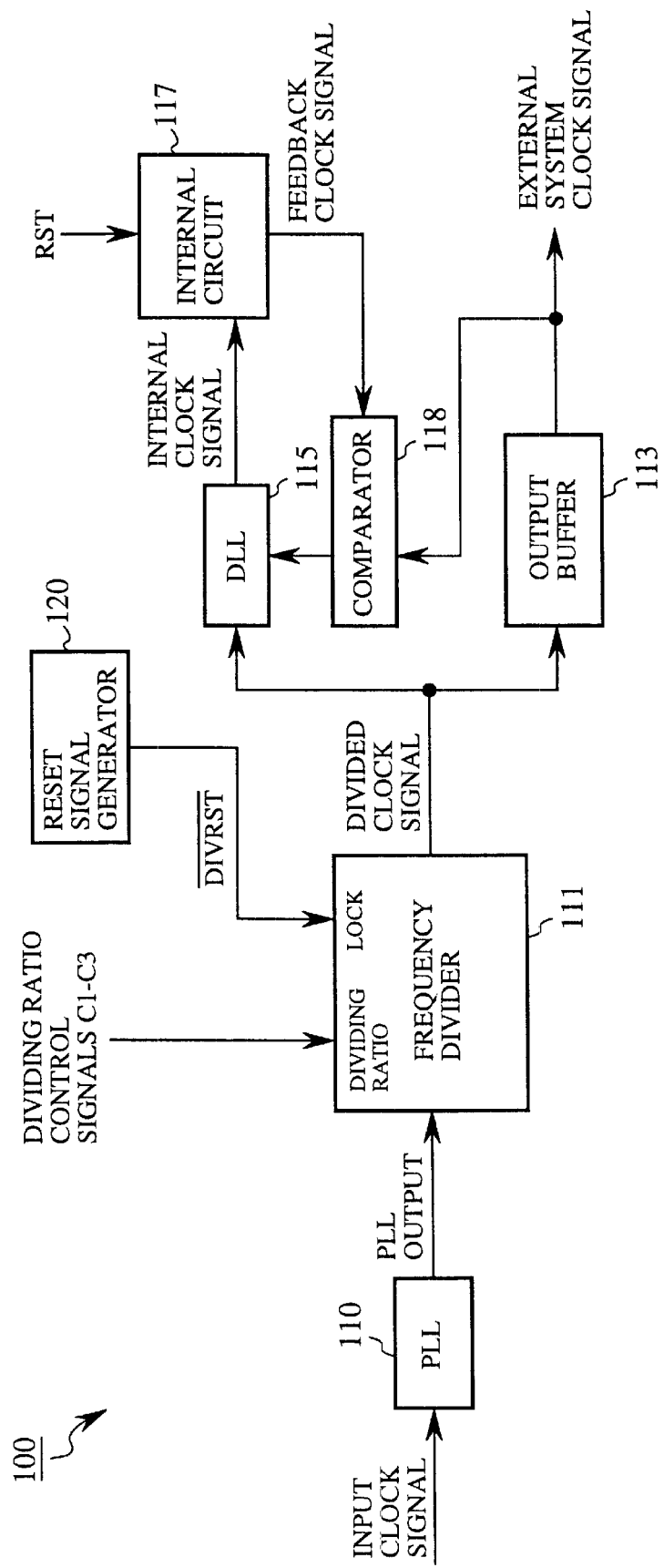
FIG. 5 is a block diagram showing an embodiment 2 of the clock generator in accordance with the present invention.

FIG. 5 is a block diagram showing an embodiment 2 of the clock generator in accordance with the present invention. Referring to FIG. 5, the clock generator 100 comprise a PLL 110 that receives an input clock signal from the outside or inside of the semiconductor device; and a frequency divider 111 that receives the PLL output of the PLL 110, and the dividing ratio control signals C1–C3.

The clock generator 100 further comprises an output buffer 113 that receives a divided clock signal from the frequency divider 111 and outputs an external system clock signal; a comparator 118 that compares the phase of the external system clock signal with that of the feedback clock signal and sets a delay quantity of a DLL 115 in accordance with the compared result; the DLL 115 that receives the divided clock signal from the frequency divider 111 and controls its delay quantity in response to the output of the comparator 118; and an internal circuit 117 that receives the internal clock signal from the DLL 115 and the reset signal RST.

The frequency divider 111 further receives an inverted frequency divider reset signal (referred to as NDIVRST from now on).

Figure 6:
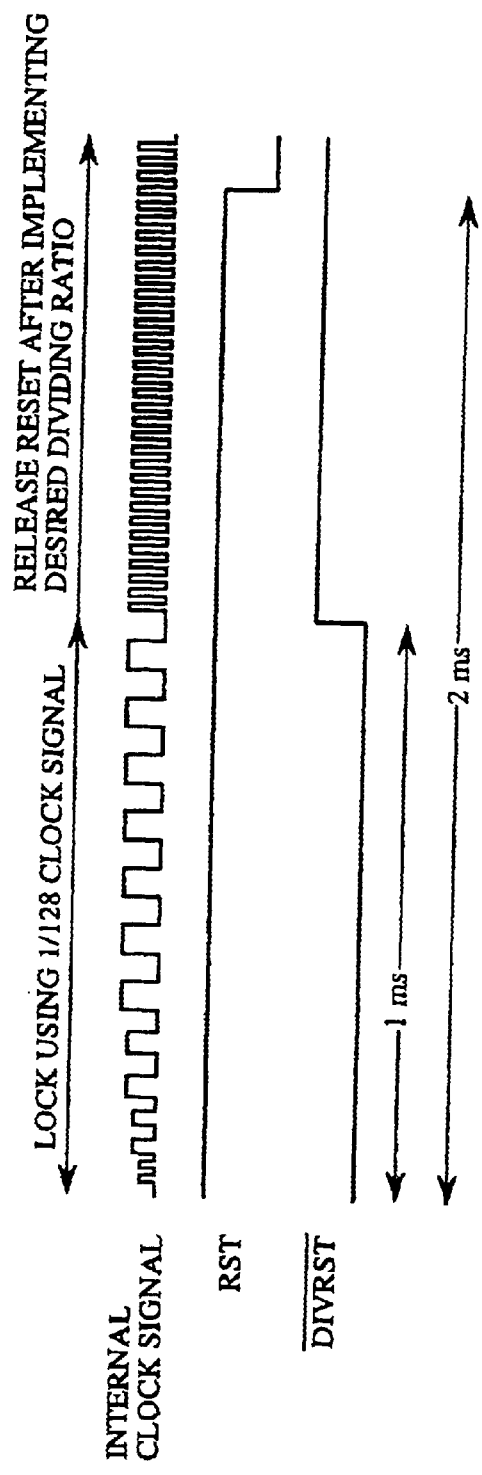
FIG. 6 is a timing chart illustrating a switching operation of the embodiment 2 of the clock generator.
Figure 9:
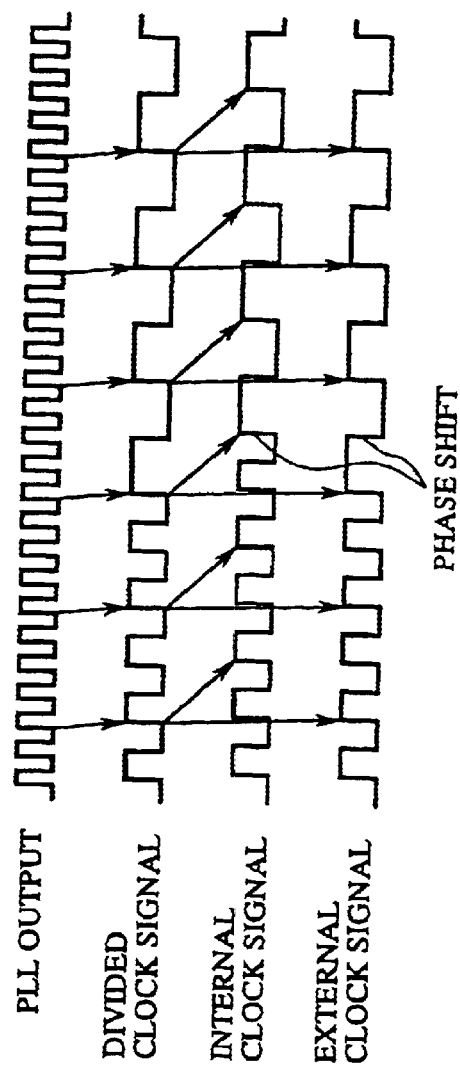
FIG. 9 is a timing chart illustrating a switching operation of the conventional clock generator.
Figure 7:
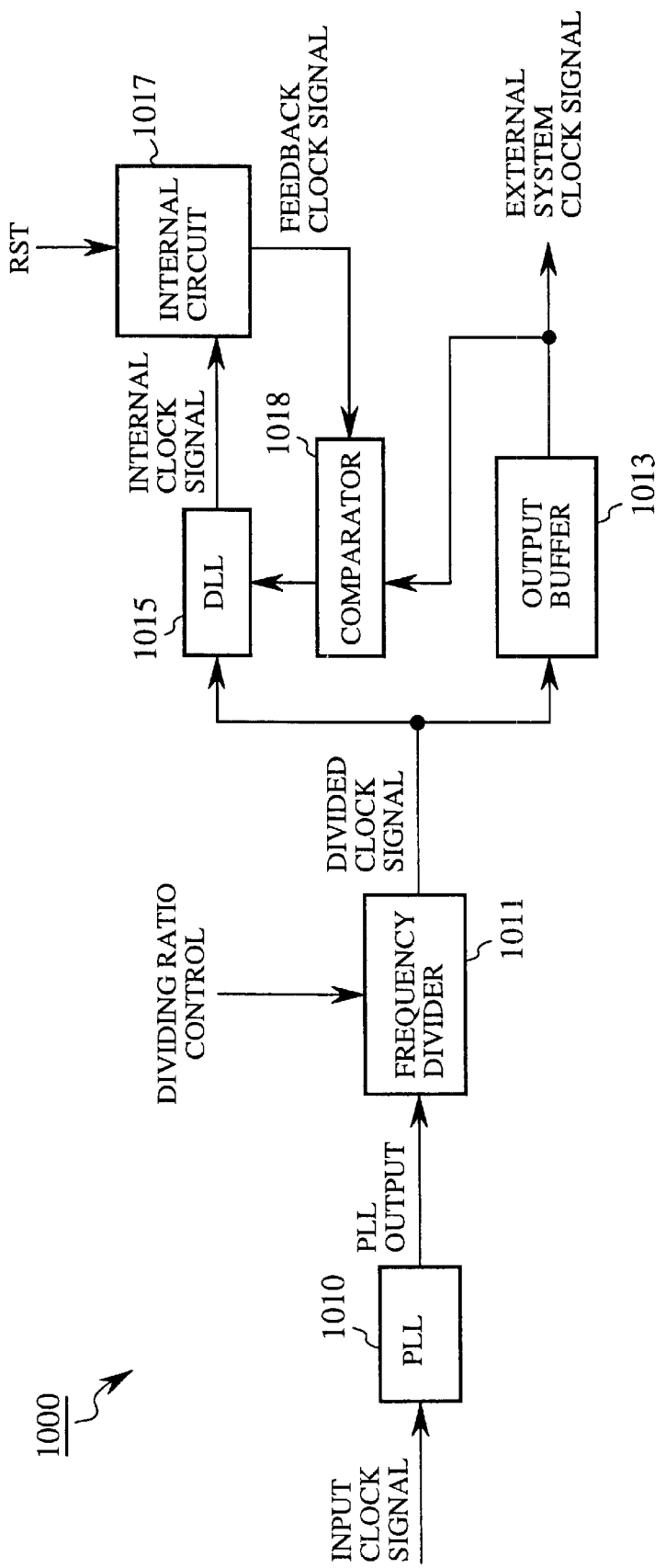
FIG. 7 is a block diagram showing a conventional clock generator.
Figure 8:
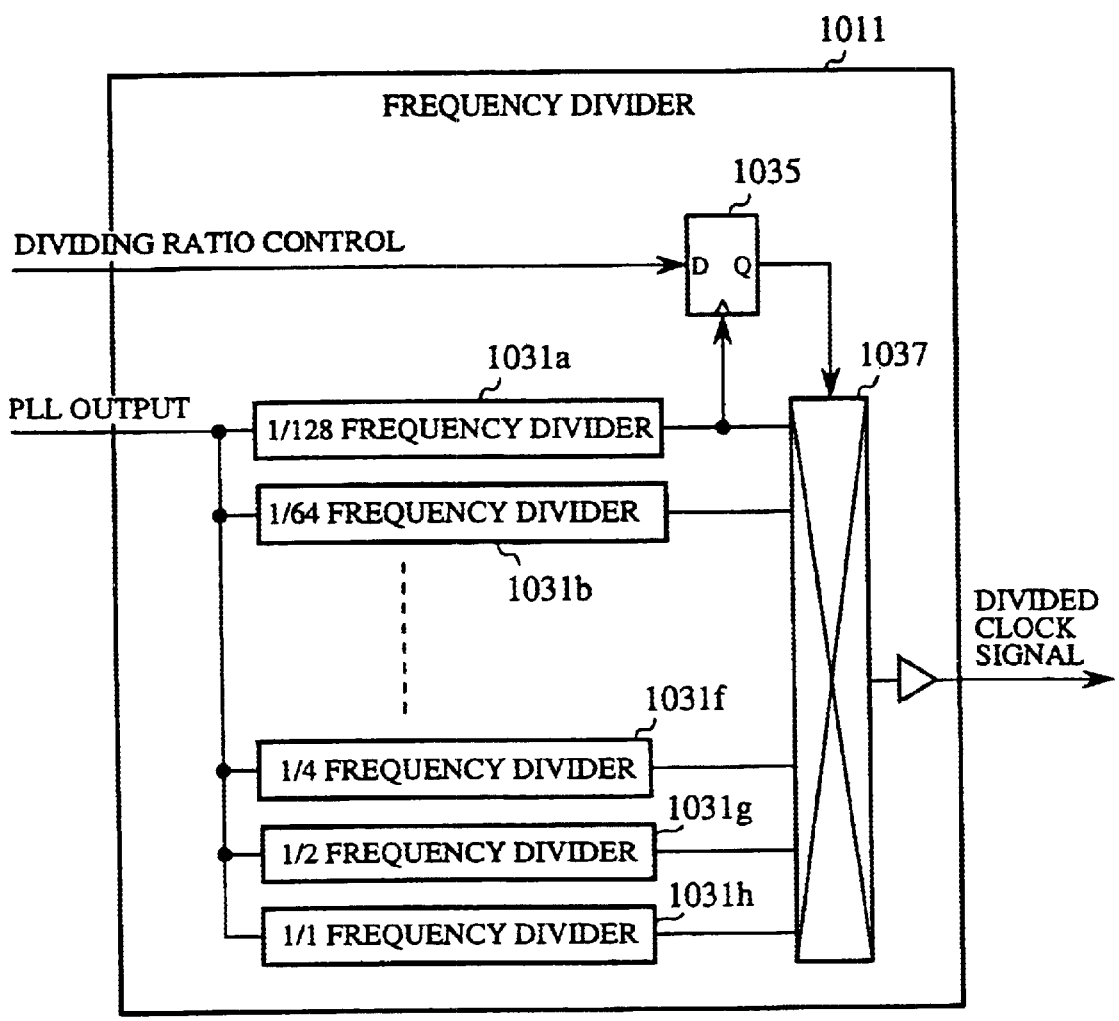
FIG. 8 is a circuit diagram showing a frequency divider of the conventional clock generator.

FIG. 6 is a timing chart illustrating the operation of the embodiment 2 of the clock generator. Referring to FIG. 6, when the clock generator 100 is reset, the reset signal RST continues the active state for more than 2 ms, and the NDIVRST signal keeps active "L" during the first 1 ms.

During the active "L" of the NDIVRST signal, the 1/128 clock signal is generated and sufficiently locked. After the active "L" of 1 ms, the NDIVRST signal is negated, and the internal clock signal is switched from 1/128 to a desired dividing ratio.

The signal NDIVRST can either be generated at the outside of the semiconductor device, or generated from the reset signal RST automatically by a reset signal generator 120 as shown in FIG. 5.

In the latter case, the signal NDIVRST is negated after counting a fixed time period or fixed clock cycles after the reset signal RST is made active. Thus, the present embodiment 2 can provide an erroneous-operation-resistant clock generator.

As described above, according to the present embodiment 2, the power consumed before the lock can be reduced because the lock is carried out using the low clock frequency. Furthermore, the internal circuit can always operate in the same state as when it starts its operation at a desired frequency. This makes it possible to prevent the phase shift between the internal clock signal and the external system clock signal when the dividing ratio is switched afterward. Moreover, the present embodiment 2 can provide the clock generator resistant to erroneous operation.

What is claimed is:

1. A clock generator comprising:
   a frequency divider for outputting a divided clock signal by dividing an input clock signal in accordance with a dividing ratio control signal;
   an external clock output circuit for generating an external clock signal from the divided clock signal;
   an internal clock output circuit for generating an internal clock signal from the divided clock signal; and
   a phase adjusting circuit for adjusting a phase of the internal clock signal with that of the external clock signal,
   wherein said frequency divider further comprises a dividing ratio control signal inhibiting circuit for disabling the dividing ratio control signal as long as a lock signal supplied from said phase adjusting circuit is active, generates a particular clock signal as long as the dividing ratio control signal is disabled, and changes the frequency of the divided clock signal by enabling the dividing ratio control signal in synchronism with the particular clock signal when the lock signal is made inactive.

2. The clock generator according to claim 1, wherein the period of the particular clock signal is greater than a phase adjustable range of the internal clock signal by said phase adjusting circuit.

3. The clock generator according to claim 1, wherein the particular clock signal has a longest period in divided clock signals generated by said frequency divider.

4. The clock generator according to claim 1, further comprising an internal circuit that operates in response to the internal clock signal, wherein said clock generator maintains a reset state of said internal circuit before the divided clock signal is switched to a desired clock frequency.

5. The clock generator according to claim 1, further comprising a circuit for halting outputting the internal clock signal before the divided clock signal is switched to a desired clock frequency.

6. A clock generator comprising:
   a frequency divider for outputting a divided clock signal by dividing an input clock signal in accordance with a dividing ratio control signal;
   an external clock output circuit for generating an external clock signal from the divided clock signal;
   an internal clock output circuit for generating an internal clock signal from the divided clock signal; and
   a phase adjusting circuit for adjusting a phase of the internal clock signal with that of the external clock signal,
   wherein said frequency divider further comprises a dividing ratio control signal inhibiting circuit for disabling the dividing ratio control signal as long as a control signal takes a first value, generates a particular clock signal as long as the dividing ratio control signal is disabled, and changes the frequency of the divided clock signal by enabling the dividing ratio control signal in synchronism with the particular clock signal when the lock signal is placed at a second value.

7. The clock generator according to claim 6, wherein the period of the particular clock signal is greater than a phase adjustable range of the internal clock signal by said phase adjusting circuit.

8. The clock generator according to claim 6, wherein the particular clock signal has a longest period in divided clock signals generated by said frequency divider.

9. The clock generator according to claim 6, wherein the control signal is placed at the first value at power-on.

10. The clock generator according to claim 6, wherein the control signal is placed at the first value at a reset.

11. The clock generator according to claim 9, wherein the control signal is placed at the second value after a fixed time interval or after fixed clock cycles after the control signal is placed at the first value.

12. The clock generator according to claim 10, wherein the control signal is placed at the second value after a fixed time interval or after fixed clock cycles after the control signal is placed at the first value.

13. The clock generator according to claim 6, wherein the control signal is placed at the second value after the output clock signal is stabilized.

14. The clock generator according to claim 6, further comprising an internal circuit that operates in response to the internal clock signal, wherein said clock generator maintains a reset state of said internal circuit before the divided clock signal is switched to a desired clock frequency.

15. The clock generator according to claim 6, further comprising a circuit for halting outputting the internal clock signal before the divided clock signal is switched to a desired clock frequency.

* * * * *